United States Patent
Kamino et al.

(10) Patent No.: US 11,226,273 B2
(45) Date of Patent: Jan. 18, 2022

(54) SAMPLE HOLDER, ION MILLING APPARATUS, SAMPLE PROCESSING METHOD, SAMPLE OBSERVING METHOD, AND SAMPLE PROCESSING AND OBSERVING METHOD

(71) Applicant: Hitachi High-Technologies Corporation, Tokyo (JP)

(72) Inventors: Atsushi Kamino, Tokyo (JP); Hisayuki Takasu, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 631 days.

(21) Appl. No.: 16/070,468

(22) PCT Filed: Feb. 3, 2016

(86) PCT No.: PCT/JP2016/053165
§ 371 (c)(1),
(2) Date: Jul. 16, 2018

(87) PCT Pub. No.: WO2017/134764
PCT Pub. Date: Aug. 10, 2017

(65) Prior Publication Data
US 2019/0033182 A1  Jan. 31, 2019

(51) Int. Cl.
*G01N 1/32* (2006.01)
*H01J 37/20* (2006.01)
*H01J 37/305* (2006.01)

(52) U.S. Cl.
CPC ................ *G01N 1/32* (2013.01); *H01J 37/20* (2013.01); *H01J 37/3053* (2013.01);
(Continued)

(58) Field of Classification Search
CPC ........ G01N 1/32; H01J 37/20; H01J 37/3005; H01J 37/305; H01J 37/3053;
(Continued)

(56) References Cited

U.S. PATENT DOCUMENTS

2002/0166976 A1  11/2002  Sugaya et al.
2002/0194938 A1  12/2002  Koo et al.
(Continued)

FOREIGN PATENT DOCUMENTS

DE    11 2011 103 860 T5    8/2013
JP         11-258130 A         9/1999
(Continued)

OTHER PUBLICATIONS

Machine Translation of 2002-231171 (Year: 2002).*
(Continued)

*Primary Examiner* — Rodney G McDonald
(74) *Attorney, Agent, or Firm* — Crowell & Moring LLP

(57) ABSTRACT

The present invention is directed to a side entry type sample holder which enables observation with an observation apparatus without removing the sample to be analyzed from the sample holder after processing the sample to be analyzed by a processing apparatus. The sample holder includes a grip, a sample holder main body extending from the grip, a tip portion which is connected to the sample holder main body and provided with a sample table for fixing a sample, and a mechanism which changes a relative positional relationship between a processing surface of the sample fixed to the sample table and an irradiation direction of an ion beam, and causes the tip portion to avoid irradiation with the ion beam during sample processing.

11 Claims, 12 Drawing Sheets

(52) U.S. Cl.
CPC ... *H01J 2237/026* (2013.01); *H01J 2237/204* (2013.01); *H01J 2237/2007* (2013.01); *H01J 2237/20214* (2013.01); *H01J 2237/31745* (2013.01)

(58) Field of Classification Search
CPC ......... H01J 2237/026; H01J 2237/2007; H01J 2237/20214; H01J 2237/204; H01J 2237/31745
USPC .................................................. 204/298.36
See application file for complete search history.

(56) References Cited

U.S. PATENT DOCUMENTS

| | | | |
|---|---|---|---|
| 2013/0220806 A1* | 8/2013 | Iwaya | H01J 37/20 204/298.32 |
| 2013/0240353 A1 | 9/2013 | Watanabe et al. | |

FOREIGN PATENT DOCUMENTS

| | | |
|---|---|---|
| JP | 2002-231171 A | 8/2002 |
| JP | 2005-43382 A | 2/2005 |
| JP | 2013-80605 A | 5/2013 |
| KR | 2002-0096551 A | 12/2002 |

OTHER PUBLICATIONS

International Search Report (PCT/ISA/210) issued in PCT Application No. PCT/JP2016/053165 dated May 10, 2016 with English translation (two (2) pages).
Japanese-language Written Opinion (PCT/ISA/237) issued in PCT Application No. PCT/JP2016/053165 dated May 10, 2016 (three (3) pages).
Korean-language Office Action issued in counterpart Korean Application No. 10-2018-7018629 dated Jul. 1, 2019 with English translation (eight pages).
German-language Office Action issued in German Application No. 11 2016 005 621.4 dated Jun. 25, 2021 (eight (8) pages).

* cited by examiner

[FIG. 1]
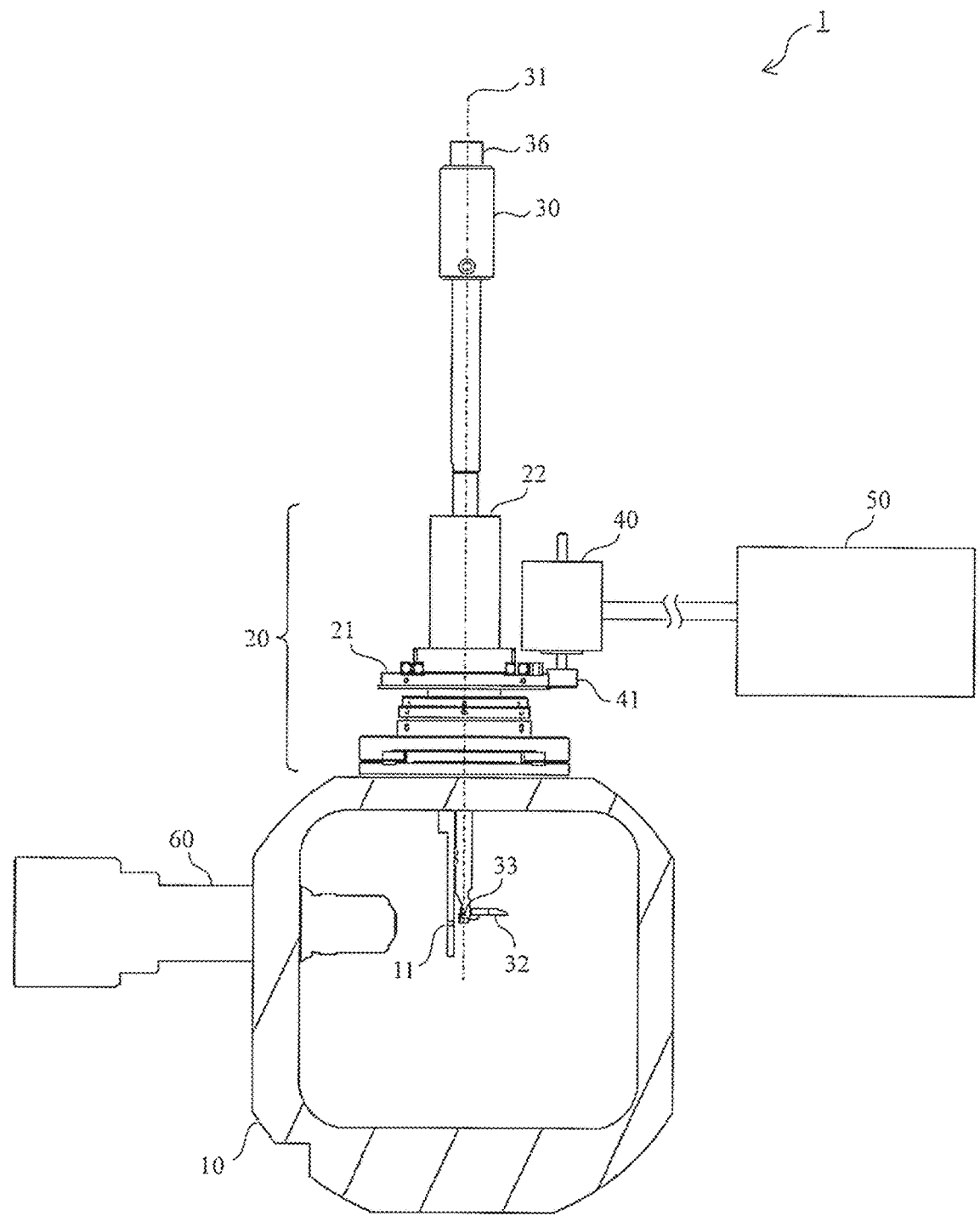

[FIG. 2A]
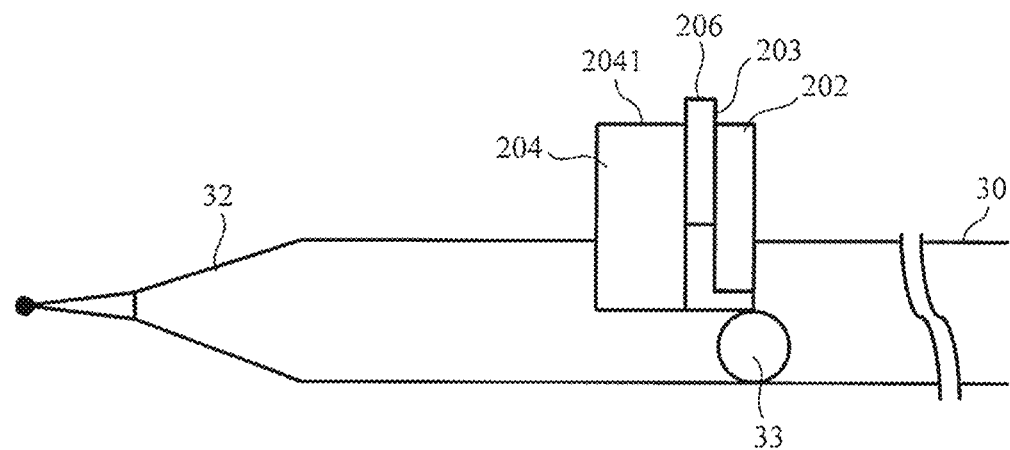
[FIG. 2B]
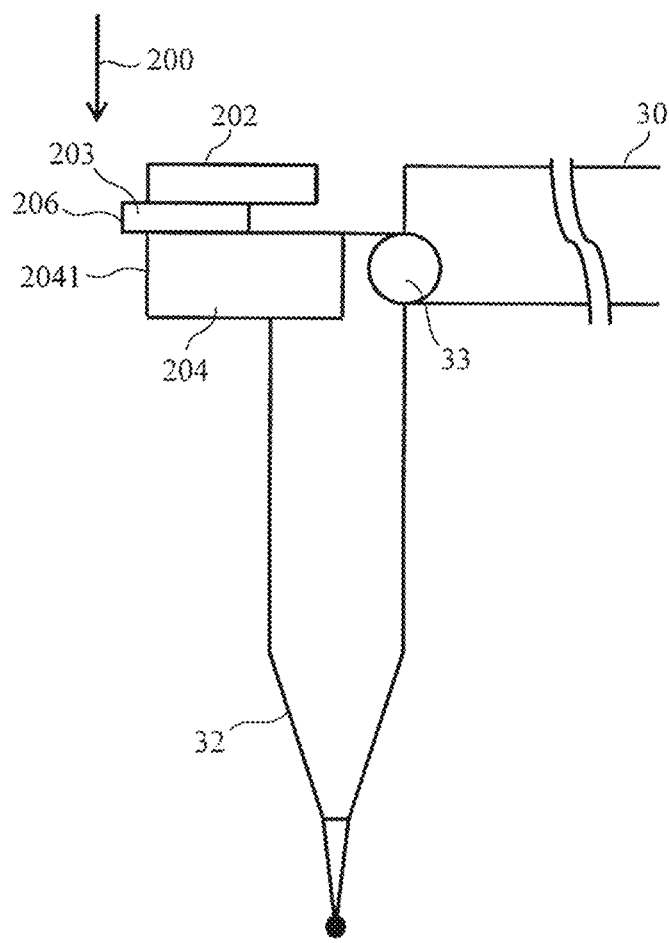

[FIG. 3A]
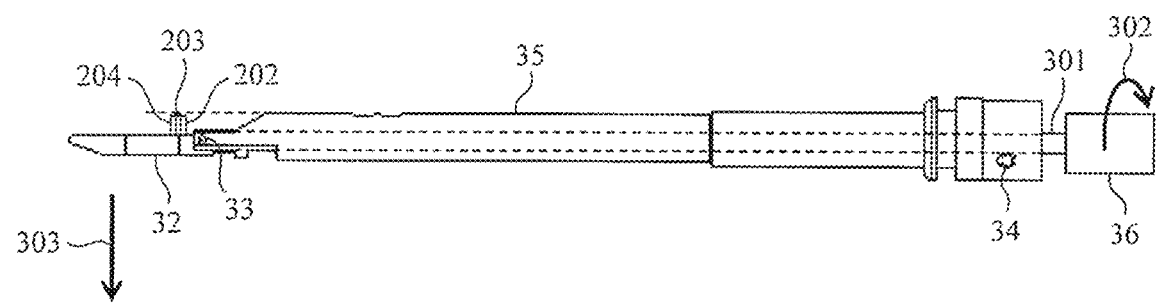
[FIG. 3B]
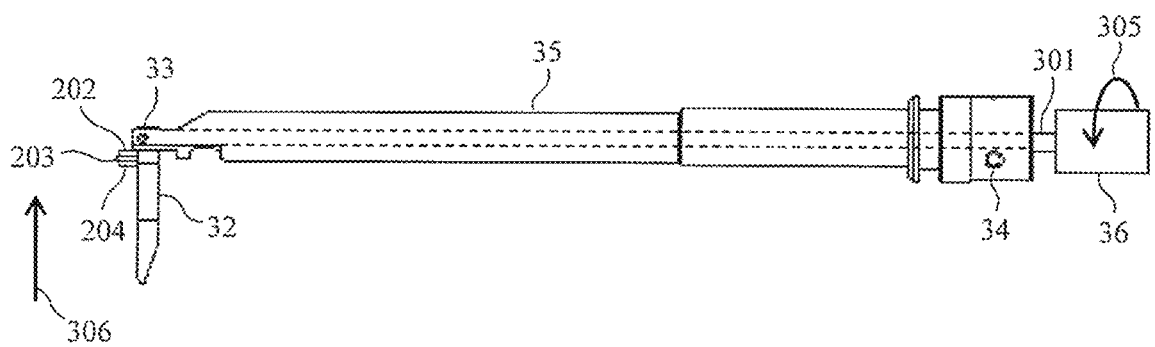

[FIG. 4A]
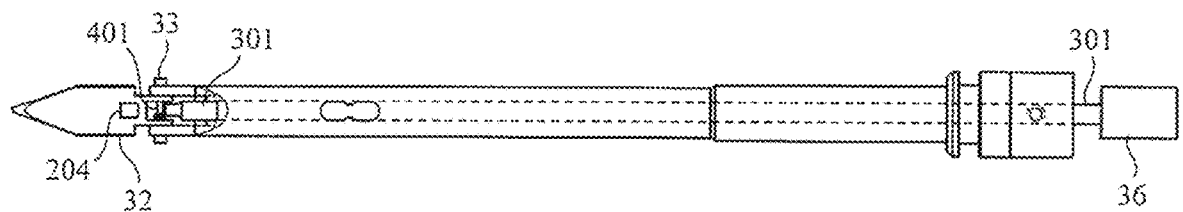
[FIG. 4B]
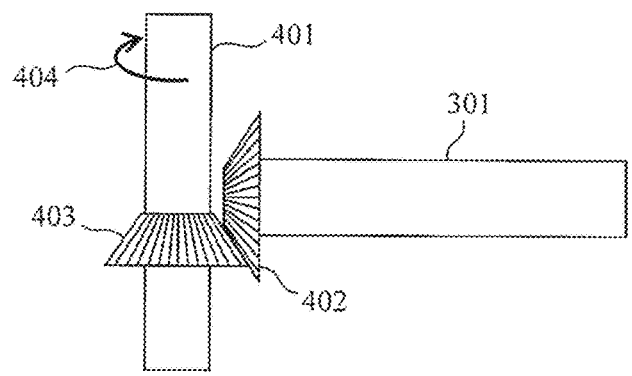

[FIG. 5]
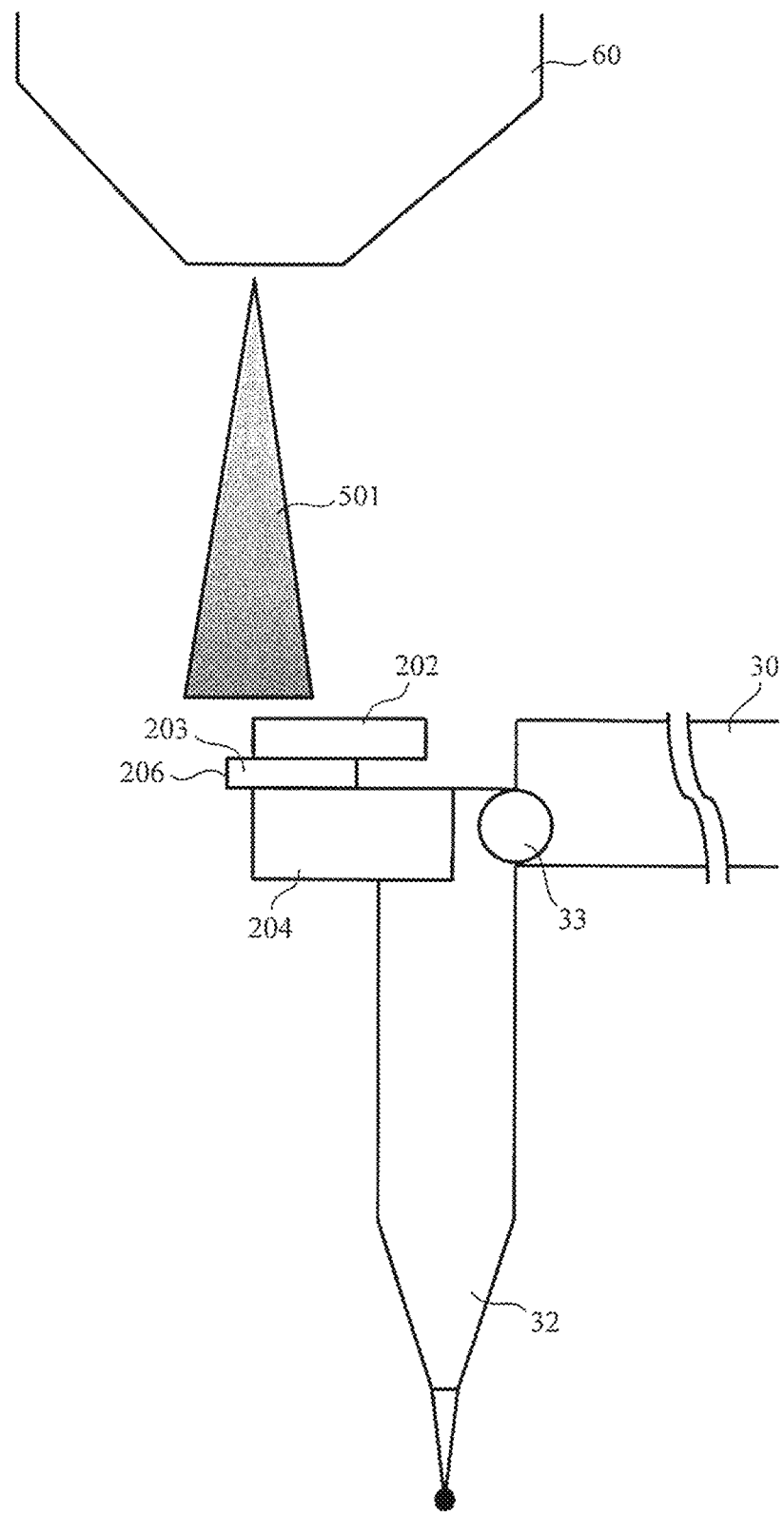

[FIG. 6]
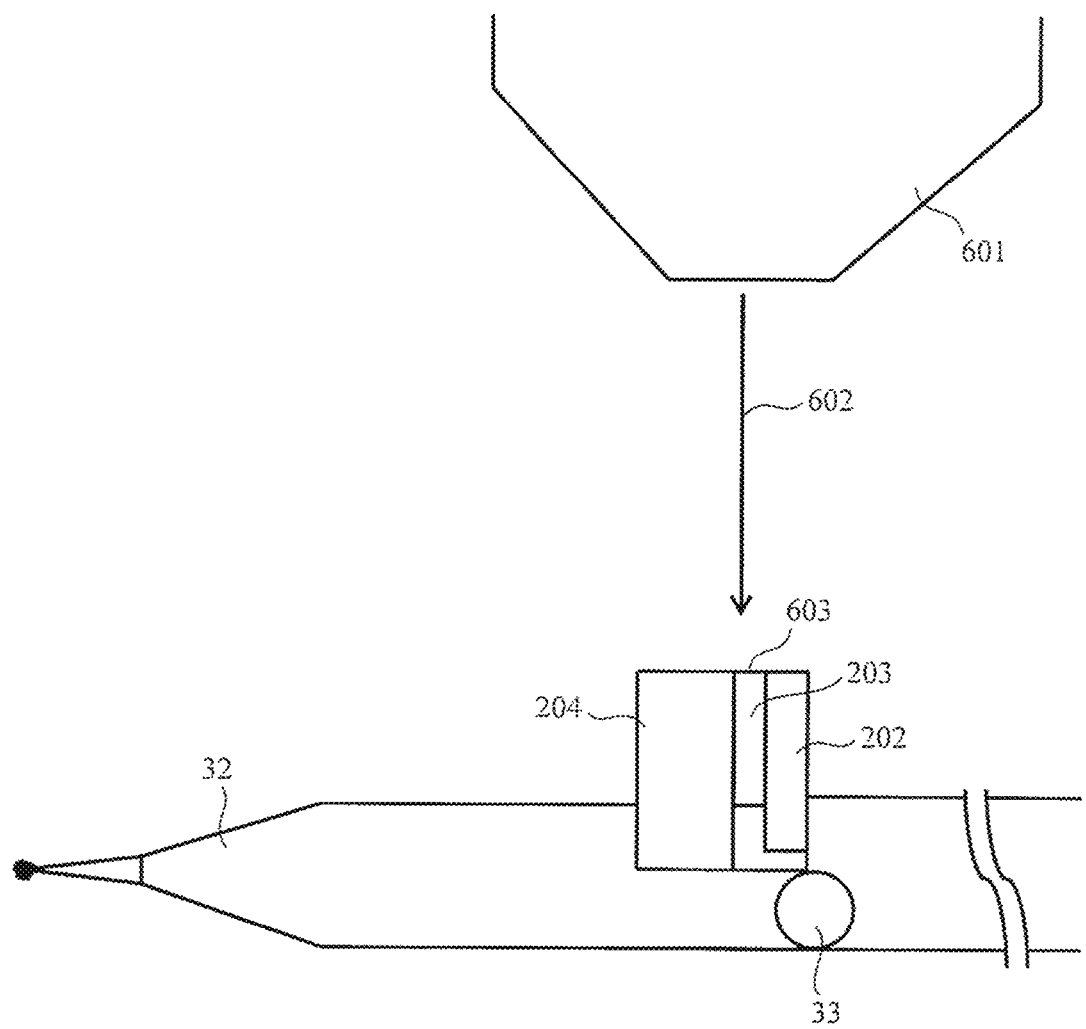

[FIG. 7]
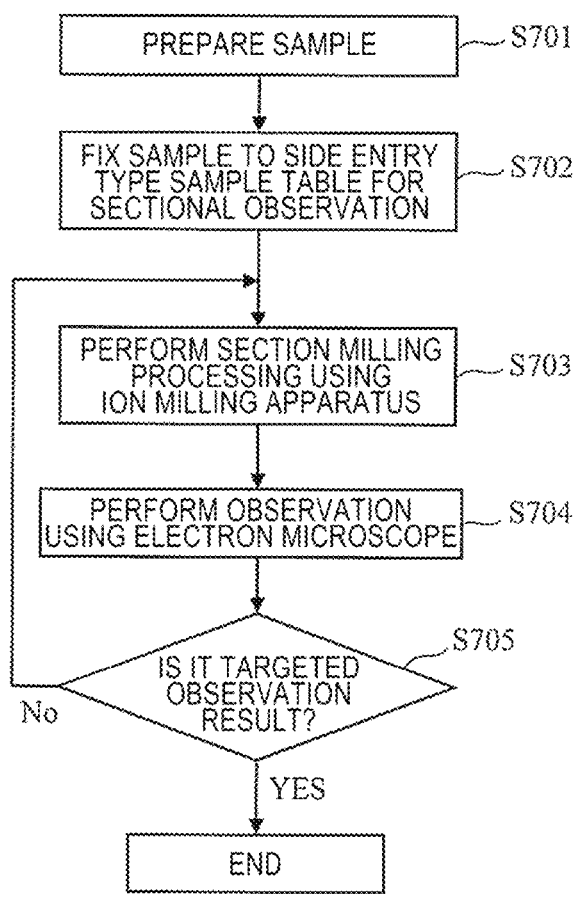

[FIG. 8]
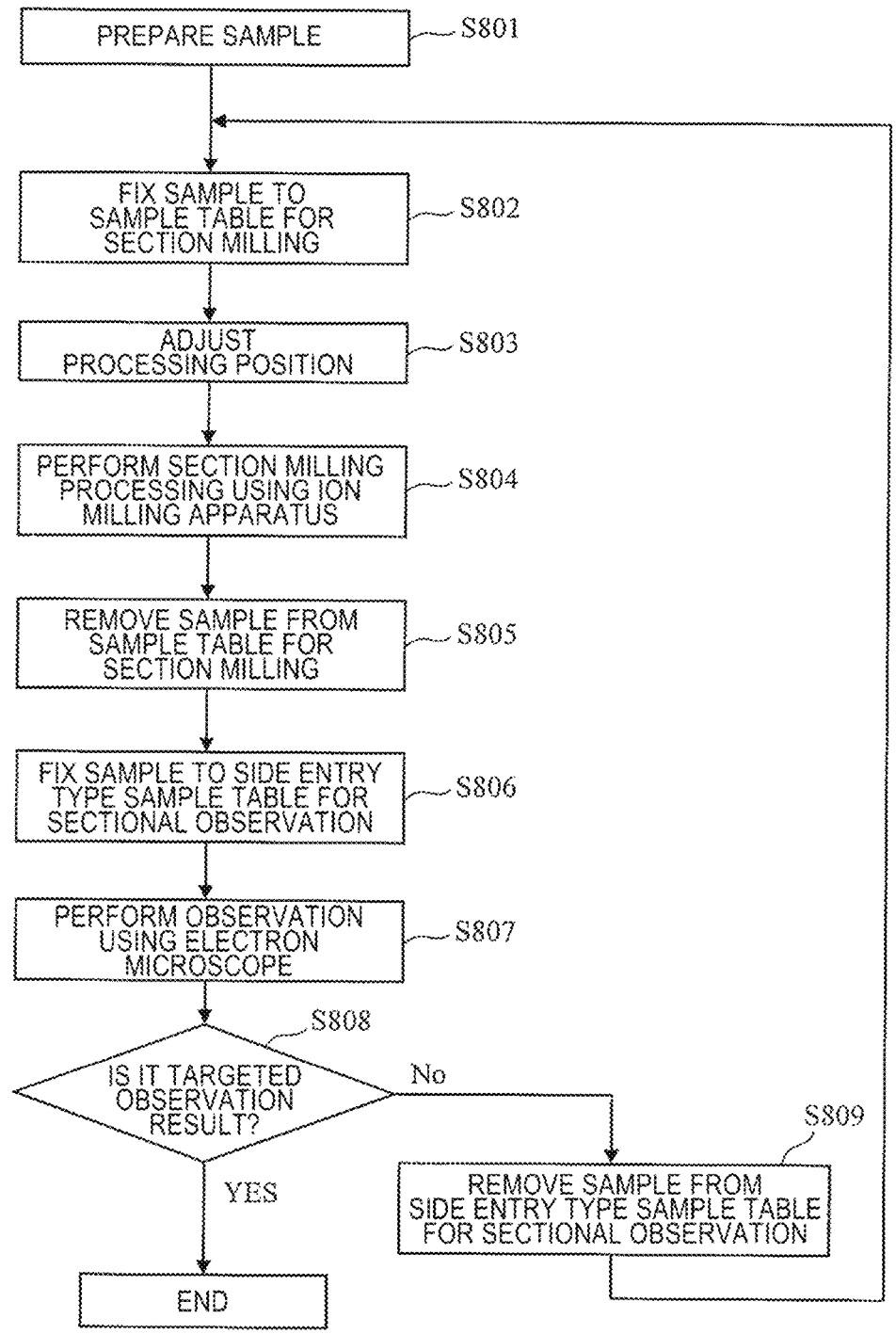

[FIG. 9]
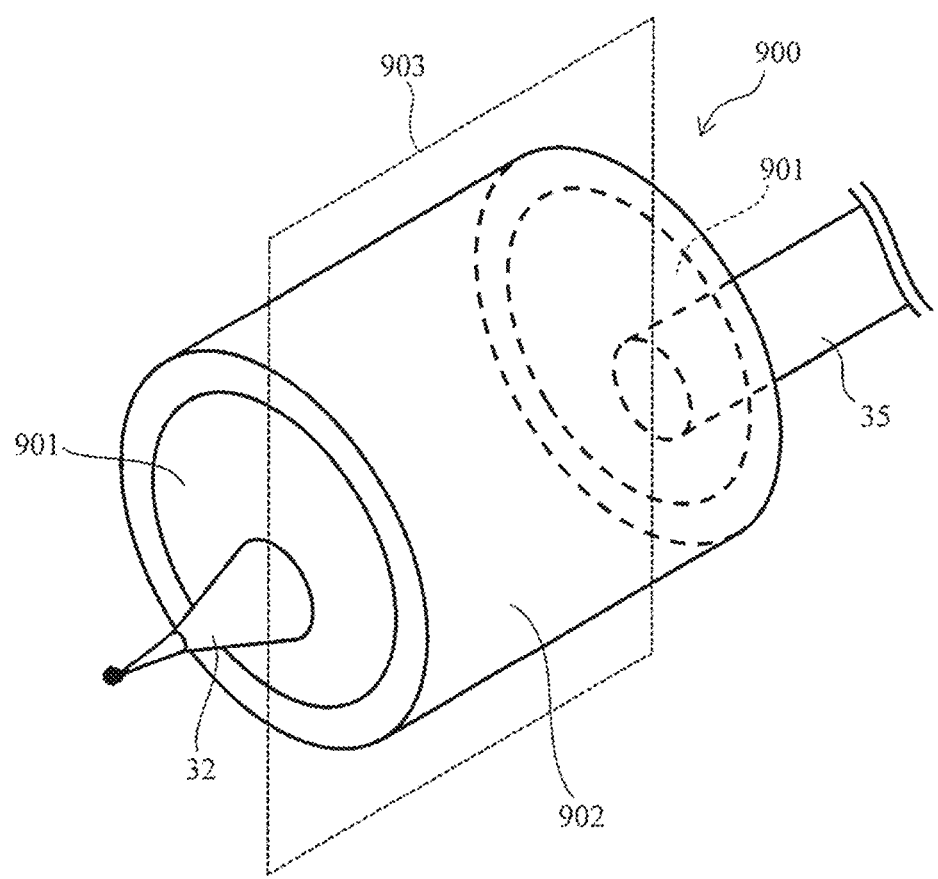

[FIG. 10A]
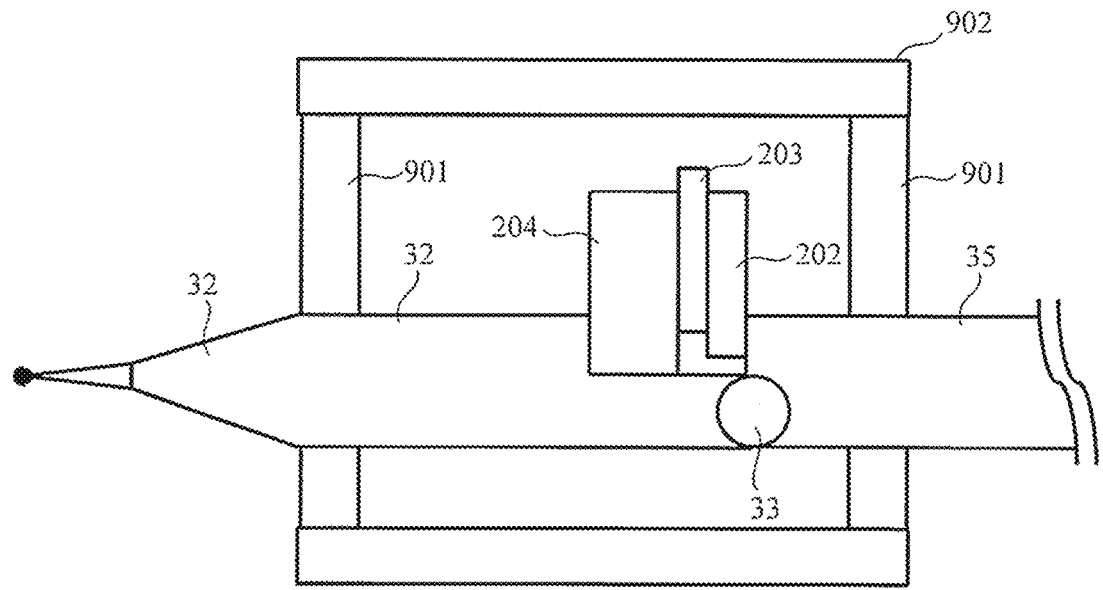
[FIG. 10B]
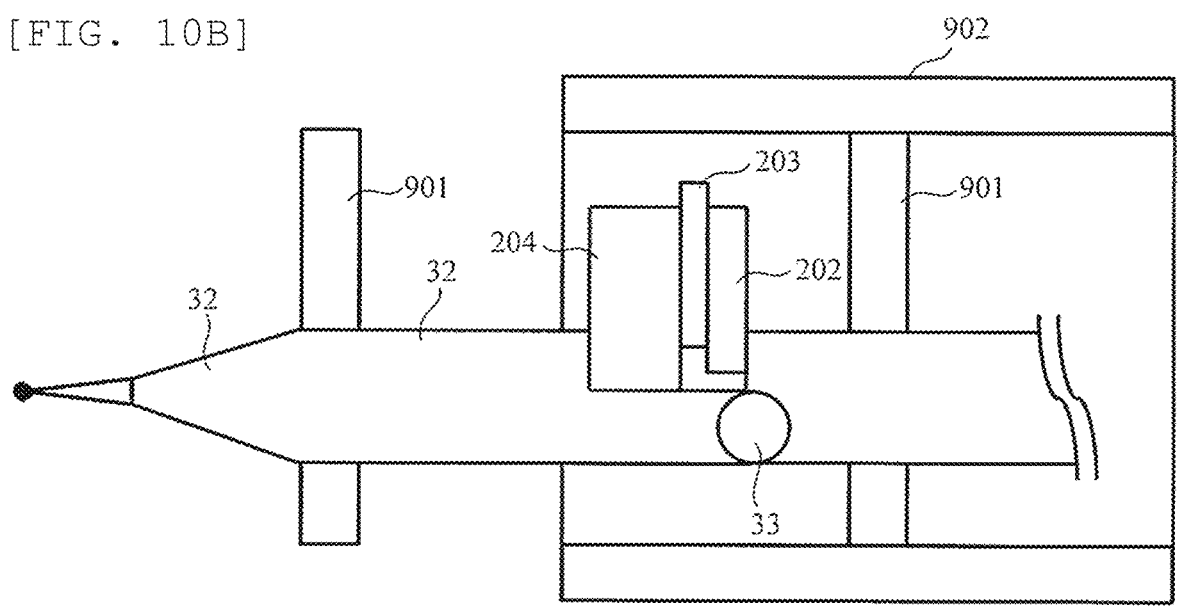

[FIG. 11]
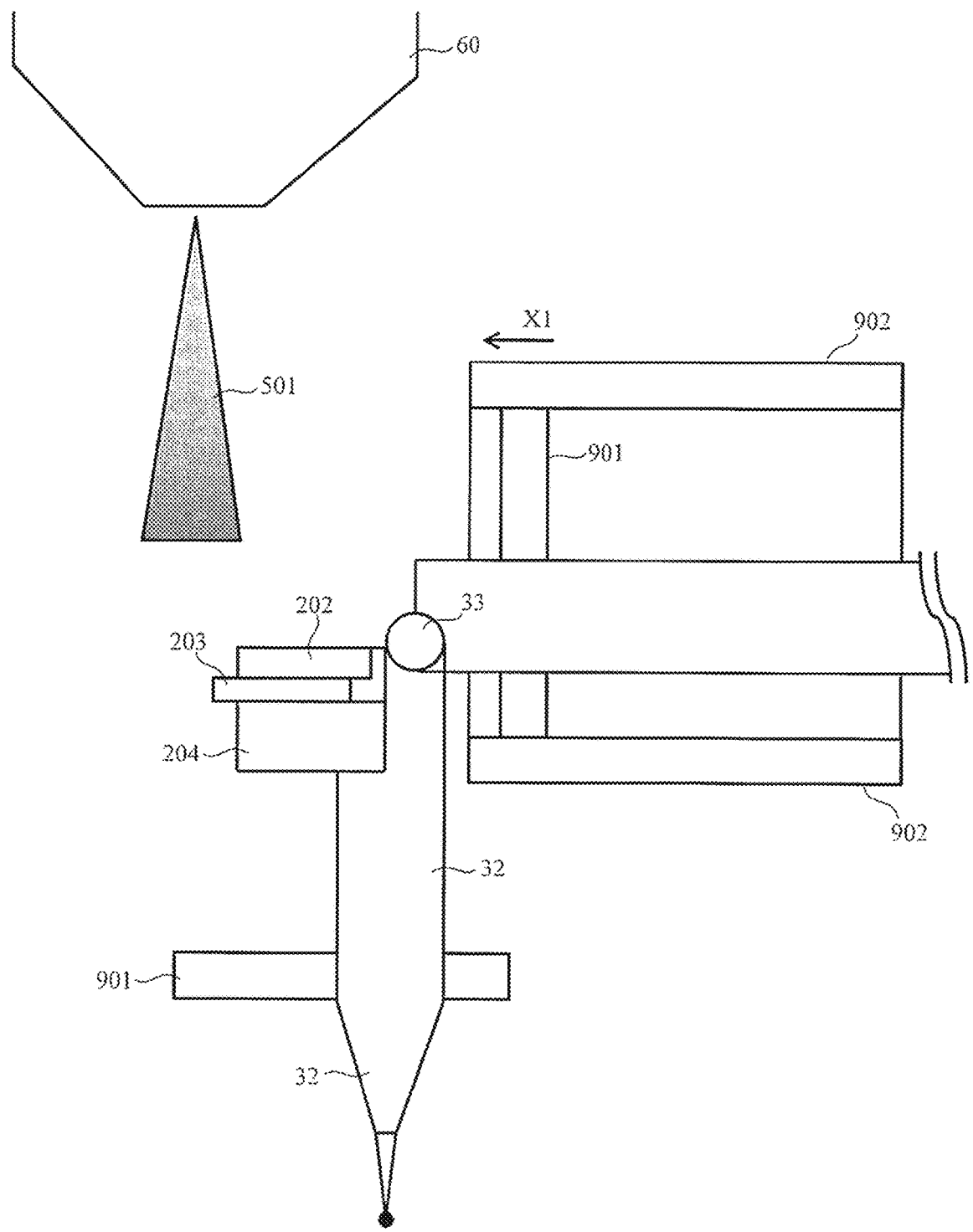

[FIG. 12]
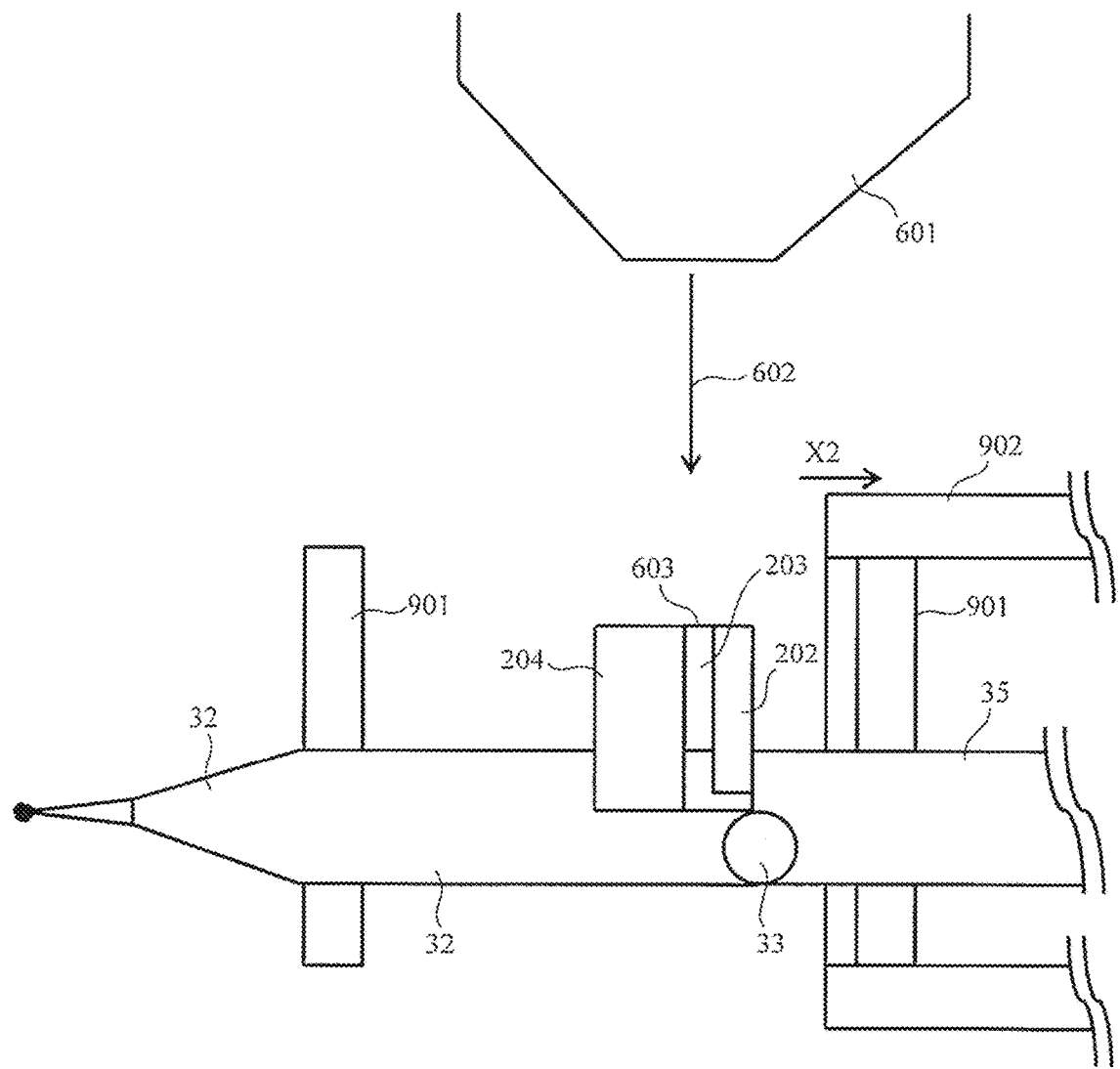

SAMPLE HOLDER, ION MILLING APPARATUS, SAMPLE PROCESSING METHOD, SAMPLE OBSERVING METHOD, AND SAMPLE PROCESSING AND OBSERVING METHOD

TECHNICAL FIELD

The present invention relates to a sample holder, an ion milling apparatus, a sample processing method, a sample observing method, and a sample processing and observing method.

BACKGROUND ART

An ion milling apparatus is an apparatus which scrapes a sample smoothly without stress using a physical sputtering phenomenon in which ions such as argon generated in an anode are accelerated to approximately 10 kV or less (in order to reduce damage of a sample) and the sample is irradiated with the ions without being focused to flip sample atoms from a sample surface.

A scrapped amount when irradiating the sample with an ion beam depends on a composition of the sample, an irradiation angle of the ion beam, a crystal orientation, and acceleration voltage of the ion beam, and the like; however, when the sample is set such that the irradiation angle of the ion beam is 90 degrees, a variation in the scrapped amount due to the sample composition can be reduced and multi-layer films having multi-compositions can also be processed smoothly. At this time, in order to prevent a position other than an ion milling target position from being irradiated with the ion beam, when irradiating the sample with the ion beam, a plate (hereinafter, also referred to as a shielding plate or a mask) is disposed to shield the sample at a processing target position from the ion beam in an ion beam irradiation direction (note: meaning of ion source side=ion gun side). Several hundred microns or less of the sample is exposed from the shielding plate to be irradiated with the ion beam, and the exposed sample portion can be scraped by physical sputtering to obtain a smooth sample surface.

In addition, a side entry type sample holder on which a sample to be analyzed is placed may be adopted for the ion milling apparatus (see PTL 1).

CITATION LIST

Patent Literature

PTL 1: JP-A-11-258130

SUMMARY OF INVENTION

Technical Problem

In a case of using the ion milling apparatus that processes the sample by using the side entry type sample holder of the related art as disclosed in PTL 1, the sample to be analyzed is fixed to the side entry type sample holder to perform milling processing by inserting the holder into the ion milling apparatus. In this case, the processing surface of the sample becomes parallel to the ion beam used for irradiation.

On the other hand, in a case of observing the processing surface of the sample with an electron microscope (for example, SEM or the like), it was required to coincide the processing surface of the sample with the irradiation direction of an electron beam. Therefore, it was required to extract the side entry type sample holder from the ion milling apparatus and temporally remove the sample, and then fix the sample to the holder of the electron microscope again such that the processing surface and the observation direction coincided with each other. When undergoing such a procedure, as a result, there are problems that an operation becomes complicated and the sample may be damaged.

The present invention has been made in view of the above circumstances, and proposes a side entry type sample holder which enables observation with an observation apparatus without removing the sample to be analyzed from the sample holder after processing the sample to be analyzed by a processing apparatus.

Solution to Problem

In order to solve the problems, the present invention provides a sample holder which is inserted into an ion milling apparatus so as to transverse an irradiation locus of an ion beam and is extracted from the ion milling apparatus after sample processing, the sample holder including: a grip; a sample holder main body extending from the grip; a tip portion which is connected to the sample holder main body and provided with a sample table for fixing a sample; and a mechanism which changes a relative positional relationship between a processing surface of the sample fixed to the sample table and an irradiation direction of the ion beam, and causes the tip portion to avoid irradiation with the ion beam during sample processing.

Further features relating to the present invention will become apparent from the description of the present specification and the accompanying drawings. In addition, aspects of the present invention are achieved and realized according to an element, a combination of elements, the following detailed description, and accompanying claims.

It should be understood that the description of the present specification is a merely general example and is not intended to limit the scope or application example of the present invention in any way.

Advantageous Effects of Invention

According to the present invention, in a state of attaching a sample to a side entry type sample holder, milling processing by a milling apparatus and observation by an observation apparatus can be compatible with each other, without removing the sample.

BRIEF DESCRIPTION OF DRAWINGS

FIG. 1 is a view illustrating a schematic configuration of an ion milling apparatus 1 according to the present embodiment.

FIGS. 2A and 2B are views illustrating an external configuration of a peripheral portion of a tip portion 32 of a side entry type sample holder 30 according to the present embodiment.

FIGS. 3A and 3B are views illustrating a configuration (side surface) of a side entry type sample holder according to the present embodiment.

FIGS. 4A and 4B are views illustrating a configuration of a tip portion rotation mechanism provided in the side entry type sample holder 30 according to the present embodiment.

FIG. 5 is a view illustrating an aspect when a sample is processed by using the side entry type sample holder 30 according to the present embodiment.

FIG. 6 is a view illustrating an aspect when a processing surface (a processed surface) of the sample by using the side entry type sample holder 30 according to the present embodiment.

FIG. 7 is a flowchart for describing a procedure of processing and observing the sample according to the present embodiment.

FIG. 8 is a flowchart for describing a procedure of processing and observing the sample according to a comparative example (related art example).

FIG. 9 is a view illustrating an example of an external configuration of a side entry type sample holder 900 according to a second embodiment.

FIGS. 10A and 10B are sectional views of the side entry type sample holder 900 on a plane 903 of FIG. 9.

FIG. 11 is a view illustrating an aspect in which the tip portion 32 is completely exposed and the tip portion 32 is rotated about a rotation shaft 33 as a center to be in a vertical state.

FIG. 12 is a view illustrating an aspect in which the side entry type sample holder 30 is attached to an observation apparatus (not illustrated) to observe a processing surface 603.

DESCRIPTION OF EMBODIMENTS

A side entry type sample holder according to the present embodiment includes a grip, a sample holder main body extending from the grip, a tip portion which is connected to the sample holder main body and provided with a sample table for fixing a sample, and a mechanism which changes a relative positional relationship of the sample fixed to the sample table with an irradiation direction of the ion beam, and causes the tip portion to avoid irradiation with the ion beam during the sample processing. During sample processing, since the tip portion of the sample holder moves to a position at which an irradiation with the ion beam can be avoided (takes a refuge state), the tip portion can be prevented from being damaged due to exposure to the ion beam.

Specifically, the mechanism rotates the tip portion toward a direction opposite to a direction in which the ion source of an ion milling apparatus has been provided, from a state where the tip portion is horizontal to the sample holder main body.

Further specifically, the mechanism includes a first shaft that is housed inside the sample holder main body, extends in a direction from the connecting portion to the grip, and has a first gear and a second shaft that has the same axis as the rotation shaft of the tip portion and has a second gear. Then, an operation is performed in such a manner that when a rotational force for rotating the first shaft is applied around an axis of the first shaft, the rotational force is transmitted to the second gear via the first gear to rotate the second shaft. Accordingly, the tip portion rotates so as to be away from the ion source and transits to a state where the tip portion becomes perpendicular to the sample holder main body, from a state of being horizontal to the sample holder main body.

Hereinafter, embodiments of the present invention will be described with reference to the accompanying drawings. In the accompanying drawings, the same functional elements may be represented by the same numerals. The accompanying drawings show specific embodiments and implementations in accordance with the principle of the present invention, but these are for understanding the present invention and are not used to interpret the present invention in a limited way.

In the present embodiment, the descriptions are made in sufficient detail to implement the present invention by those skilled in the art, but it should be understood that other implementations and configurations are possible and, without departing from the scope and spirit of the technical idea, modifying a configuration or a structure and replacing various elements are possible. Accordingly, the following description should not be interpreted by being limited thereto.

(1) First Embodiment

<Ion Milling Apparatus>

FIG. 1 is a view illustrating a schematic configuration of an ion milling apparatus 1 according to the present embodiment. The ion milling apparatus 1 includes a sample chamber 10, a stage 20, a side entry type sample holder 30, a motor 40, a control unit 50, and an ion gun 60.

The ion gun 60 irradiates a target (sample) with an unfocused ion beam to process the sample.

An inside of the sample chamber 10 can be evacuated by using a vacuum evacuation device (not illustrated). In addition, the sample chamber 10 is provided with a flare prevention diaphragm 11. When processing the sample, irradiation is performed with the ion beam not focused. Therefore, the flare prevention diaphragm is for preventing a part other than a sample placed on the side entry type sample holder 30 and the shielding plate (see FIG. 2) from being irradiated with a diffused ion beam.

The stage 20 is configured so that the side entry type sample holder 30 can be attached to the sample chamber 10 without releasing the vacuum of the sample chamber 10. In addition, the stage 20 is configured so that the side entry type sample holder 30 can be extracted from the sample chamber 10 without breaking the vacuum of the sample chamber 10.

The stage 20 is provided with a stage side gear 21 and is configured so that the stage side gear 21 meshes with a motor side gear 41 of the motor 40. Then, when the motor rotates, the rotational force thereof is transmitted to the stage side gear 21 via the motor side gear 41 to rotate the rotation base 22 of the stage 20. Hereinafter, the motor 40, a motor side gear 41, and the stage side gear 21 are collectively referred to as a "swing mechanism".

Since the rotation base 22 is in close contact with the side entry type sample holder 30, when the rotation base 22 rotates, the side entry type sample holder 30 also rotates about the rotation shaft 31 (rotates by predetermined angles respectively in a direction clockwise and counterclockwise) according to the rotation. A rotation speed and a rotation angle of the motor 40 are controlled by the control unit (control unit: for example, a computer) 50. The rotation is also referred to as a swing. According to the rotation, the irradiation angle of the ion beam with which the ion gun 60 performs irradiation can be changed to obtain an effect of preventing streaks from being formed on the processing surface of the sample. The rotation angle (swing angle) $\theta$ is set to, for example, approximately $-40$ degrees$\leq\theta\leq$approximately $+40$ degrees. The an input device or a display device (not illustrated) is connected to the control unit 50 and an operator can instruct the rotation amount (swing amount) or a speed of the side entry type sample holder 30 using the input device. The motor 40 and the control unit 50 for driving the motor 40 may not be integrated with the stage 20.

In the side entry type sample holder 30, by rotating a knob 36, the tip portion (pivot) 32 is configured so that a horizontal state can be changed to a vertical state about a rotation shaft 33 as the center (the rotation mechanism will be described later). For example, in a case where the tip portion is in the horizontal state, when the knob 36 is rotated clockwise, the tip portion 32 becomes in the vertical state (a state in FIG. 1). On the contrary, when the tip portion is in the vertical state, if the knob 36 is rotated counterclockwise, the tip portion 32 returns to the horizontal state. When the side entry type sample holder is inserted into the stage 20, the tip portion 32 is kept in the horizontal state, and after insertion, the tip portion 32 is changed to the vertical state as shown in the drawing during sample processing. Then, the irradiation is performed with the ion beam and the sample placed on an end of the side entry type sample holder (specifically, near the rotation shaft 33) is processed with the ion beam via the flare prevention diaphragm 11.

<External Configuration of Tip Portion of Side Entry Type Sample Holder>

FIG. 2 is a view illustrating an external configuration of a peripheral portion of the tip portion 32 of the side entry type sample holder 30 according to the present embodiment. FIG. 2(a) illustrates a state (horizontal state) when the side entry type sample holder 30 is inserted into or extracted from the stage 20. In addition, FIG. 2(b) illustrates a state (vertical state) when the sample placed on the side entry type sample holder 30 is processed by the ion beam.

In the vicinity of the rotation axis 33 of the tip portion 32, a sample table 204 is provided (fixed), and a sample 203 is placed on the sample table 204. In addition, a shielding plate 202 is attached to an upper surface of the sample 203. A side surface of the sample 203 protrudes slightly (for example, by the amount (of milling) to be processed) from the shielding plate 202 and the sample table 204.

As shown in FIG. 2(a), in a case where the tip portion 32 is in the horizontal state, a side surface portion 2041 of the sample table 204 and a processing surface (processing target surface) 206 of the sample face an ion beam irradiation direction 200.

On the other hand, as shown in FIG. 2(b), when processing the sample 203, the tip portion 32 is rotated about the rotation axis 33 as the center to change the state to the vertical state. Since the sample table 204 is fixed to the tip portion 32, the stage of the sample table 204 is also changed as the same along with the change of the state of the tip portion 32. When the tip portion is in the horizontal state, the side surface portion 2041 of the sample table 204 faces the ion beam irradiation direction 200, but when the tip portion 32 is changed to the vertical state, the side surface portion 2041 becomes in a state parallel with the ion beam irradiation direction 200. Since the sample is sandwiched between the sample table 204 and the shielding plate 202, the state of the sample is also changed. In other words, the processing surface 206 of the specimen 203 becomes in a state of parallel with the ion beam irradiation direction 200, from a state of vertical thereto.

In the side entry type sample holder 30, a unit for adjusting a position of the shielding plate 202 by precision micromanipulator such as a one-or-more directions (axes) micrometer or the like may be provided.

<Configuration of Side Entry Type Sample Holder (Side Surface)>

FIG. 3 is a view illustrating a configuration (side surface) of a side entry type sample holder according to the present embodiment. FIG. 3(a) illustrates an aspect of a state (horizontal state) when the tip portion 32 is not rotated. FIG. 3(b) illustrates an aspect of a state (vertical state) when the tip portion 32 is rotated.

The side entry type sample holder 30 includes a grip 34, a sample holder main body 35 extending from the grip 34, the tip portion 32 which is connected to the sample holder main body and provided with the sample table 204 for fixing a sample.

A shaft 301 is connected to the knob 36, and the shaft 301 extends from an inside of the side entry type sample holder 30 to the vicinity of the rotation shaft 33.

When the knob 36 is rotated, for example, in a clockwise direction 302, the shaft 301 also rotates in the clockwise direction 302. The tip portion 32 is folded in a downward direction 303 about the rotation shaft 33 as the center by the tip portion rotation mechanism (which will be described later using FIG. 4) to be the vertical state (FIG. 3(b)).

The tip portion 32 is irradiated at the time of rotated state (vertical state) with the ion beam and the sample 203 placed on the sample table 204 is processed. During processing the sample 203, the tip portion 32 faces the downward direction 303. Therefore, the tip portion is not exposed to the ion beam and the damage to the tip portion 32 can be prevented.

When the knob 36 is rotated in a counterclockwise direction 305 after the processing of the sample 203 is completed, the shaft 301 also similarly rotates in the counterclockwise direction 305. Then, the tip portion rises in an upward direction 306 about the rotation shaft 33 as the center by the tip portion 32 rotation mechanism described later to return to the horizontal state (FIG. 3(a)).

When the sample 203 is placed (fixed) on the sample table 204 and the tip portion 32 is in the horizontal state, a height of the upper tip portion (processing target surface 206) of the sample 203 is lower than the height of the uppermost portion of the sample holder main body 305. Accordingly, even when the side entry type sample holder 30 is subjected to an inserting and extracting operation with respect to the stage 20, the sample 203, the sample table 204, and the shielding 202 do not interfere with the inserting and extracting operation.

<Tip Portion Rotation Mechanism>

FIG. 4 is a view illustrating a configuration of the tip portion rotation mechanism provided in the side entry type sample holder 30 according to the present embodiment. FIG. 4(a) is a top view of the side entry type sample holder 30. FIG. 4(b) illustrates a configuration of a main part of the tip portion rotation mechanism.

As shown in FIG. 4(a), the shaft 301 extends from the knob 36 to the vicinity of the rotation shaft 33. In addition, a shaft 402 is provided on a portion of the rotation shaft 33 so as to traverse a side surface of the side entry type sample holder 30. That is, the center of the shaft 401 coincides with the center of the rotation shaft 33. Then, by rotating the shaft 401, the state of the tip portion 32 transitions between the horizontal state and the vertical state. The rotation of the shaft 401 is realized by rotating the shaft 301. The mechanism illustrated in FIG. 4(b) realizes such an operation.

As shown in FIG. 4(b), a bevel gear 402 is attached to an end of the shaft 301. In addition, a bevel gear 403 meshing with the bevel gear 402 is also attached to the shaft 401. When the shaft 301 is rotated clockwise by the knob 36, the bevel gear 402 provided on the tip portion of the shaft 301 also rotates clockwise. Then, the bevel gear 403 meshing with the bevel gear 402 rotates in a direction of an arrow 404, according to this, the shaft 401 also rotates in the direction of the arrow 404. According to such an operation, the tip portion 32 is displaced from the horizontal state to the vertical state. If the knob 36 is rotated counterclockwise, according to an opposite operation, the tip portion 32 returns to the horizontal state from the vertical state.

<Aspect when Sample Processing>

FIG. 5 is a view illustrating an aspect when a sample 203 is processed by using the side entry type sample holder 30 according to the present embodiment. Substantially, the flare prevention diaphragm 11 that regulates an irradiation size of an ion beam 501 is provided above the shield plate 202.

During processing, the tip portion 32 of the side entry type sample holder 30 becomes to the vertical state, that is, to be parallel to an ion beam irradiation direction. The processing surface (processing target surface) 206 of the sample 203 also becomes parallel to the ion beam irradiation direction. In this state, when a projected portion of the sample 203 is irradiated with the ion beam 501, the projected portion of the sample 203 is scraped (the shielding plate 202 may be scraped together in some cases) and the processing surface is exposed. In addition, during processing, the side entry type sample holder 30 is rotated (swung) around the rotation shaft 31 by a predetermined angle by the swing mechanism described above (see FIG. 1), whereby the sample 203 can be swung at the same time. Accordingly, it is possible to prevent stripes from being formed on the processing surface of the sample 203, by the ion beam 501. In addition, since the tip portion 32 can be retracted downward during processing, the tip portion 32 can be prevented from being irradiated with the ion beam 501. Accordingly, it is possible to avoid a situation that the tip portion 32 is damaged by being scraped by the ion beam 501.

<Aspect when Observing Processing Surface of Sample>

FIG. 6 is a view illustrating an aspect when a processing surface (a processed surface) of the sample by using the side entry type sample holder 30 according to the present embodiment.

After processing the sample, the tip portion 32 of the side entry type sample holder 30 is set to the horizontal state to be extracted from the stage 20 of the ion milling apparatus 1, and attached to an electron microscope apparatus (the entire apparatus is not illustrated). In this state, a processing surface (a processed surface) 603 of the sample 203 faces an electron gun 601. Therefore, the processing surface 603 can be observed by being irradiated with an electron beam 602 as it is.

Accordingly, it is not required to remove the sample 203 from the side entry type sample holder 30 and attach the sample again by changing a direction and it is possible to perform an ion milling processing and an SEM observation using the same holder.

Here, an electron microscope is used as an example of the observation apparatus, but the processing surface 603 may be observed using another observation apparatus.

<Procedure of Processing and Observing Sample>

(i) Case of Present Embodiment

FIG. 7 is a flowchart for describing a procedure of processing and observing the sample according to the present embodiment.

(i-1) Step 701

An operator pretreats the sample. Specifically, the sample is cut into an appropriate size (for example, a size of approximately 5 mm×5 mm). If the cut surface has unevenness, the surface is treated as even as possible.

(i-2) Step 702

The operator places the pretreated sample 203 on the sample table 204 (side entry sample table for sectional observation) of the side entry type sample holder 30. Then the operator covers an upper side of the sample 203 with the shielding plate 202, and fixes the sample 203 and the shielding plate 202 to the sample table 204. At this time, an end portion of the sample is caused to be slightly projected from the sample stage 204 and the shielding plate 202. The amount to be projected is approximately equal to the amount to be removed by the ion milling. Since a position of the sample is uniquely determined when using the side entry type sample holder 30 according to the present embodiment, it is not required to adjust a sample processing position.

When the sample 203 is placed on the sample table 204, the operator inserts the side entry type sample holder 30 into the stage 20.

(i-3) Step 703

The operator changes the state of the tip portion 32 of the side entry type sample holder 30 to the vertical state from the horizontal (see FIG. 2). Then, a section ion milling processing is performed inside the sample chamber 10 of the ion milling apparatus 1. During processing, the side entry type sample holder 30 is controlled to rotate about the shaft 31 as the center clockwise and counterclockwise by predetermined angle by the swing mechanism described above, thereby preventing streaks from being formed on the processing surface (processing target surface) 206.

When the processing ends, the stated of the tip portion 32 is changed to the horizontal state from the vertical state, and the side entry type sample holder 30 is extracted from the stage 20.

(i-4) Step 704

The operator inserts the side entry type sample holder 30, on which the processed sample is placed, into the observation apparatus (electron microscope apparatus). In this case, the tip portion 32 is kept in the horizontal state, and the processing surface (a processed surface) 603 is caused to face the electron gun 601 (so that the electron beam 602 and the processing surface 603 are substantially vertical), the processing surface 603 is irradiated with the electron beam 602, and the state of the processing surface 603 is observed.

(i-5) Step 705

When it is determined that a desired result has been obtained by observing the processing surface 603, the operator ends the process.

In a case where the desired observation result has not been obtained, the operator extracts the side entry type sample holder 30 from the observation apparatus, inserts the side entry type sample holder 30 into the stage 20 of the ion milling apparatus 1 again to perform the ion milling processing and observation. The operator repeats the above processing and observation until the desired observation result is obtained.

(ii) Case of Comparative Example (Related Art)

FIG. 8 is a flowchart for describing a procedure of processing and observing the sample according to a comparative example (related art example).

(ii-1) Step 801

The operator pretreats the sample. Specifically, the sample is cut into an appropriate size (for example, a size of approximately 5 mm×5 mm). If the cut surface has unevenness, the surface is treated as even as possible.

(ii-2) Step 802

The operator fixes the pretreated sample to the sample table for section milling.

(ii-3) Step 803

The operator adjusts the position of the sample so that a predetermined position of the sample is irradiated with the ion beam, using a processing position adjustment mechanism (XY axis position adjustment) provided on the sample table.

(ii-4) Step 804

The operator performs the section ion milling processing inside the sample chamber of the ion milling apparatus.

(ii-5) Step 805

The operator removes the processed sample from the sample table for section milling.

(ii-6) Step 806

The operator fixes the sample removed in Step 805 to the sample table of the side entry type sample holder for sectional observation to insert the holder to the observation apparatus (electron microscope).

(ii-7) Step 807

The operator observes the processing surface of the sample with the observation apparatus.

(ii-8) Step 808

When it is determined that a desired result has been obtained by observing the processing surface, the operator ends the process.

(ii-9) Step 809

In a case where the desired observation result has not been obtained in Step 808, the operator extracts the side entry type sample holder for sectional observation from the observation apparatus and removes the sample from the sample table of the holder.

The operator repeats operations of the processing and observation from Steps 802 to 808 until the desired observation result is obtained.

(iii) Advantage of Present Embodiment

As described above, in the procedures of the processing and observation according to the present embodiment, man-hours are less than those of the comparative example. In particular, in a case of the present embodiment, it is not required to repeat removal and attachment of the sample between the sample holder for processing and the sample holder for observation, and throughput can be improved. The attachment and removal of the sample is a work which should be performed carefully since there is concern of damaging the sample, which is a time-consuming work. In addition, in the present embodiment, since the position adjustment is not necessary when performing the sectional milling (Step 803 of the comparative example is not necessary), the procedure at the time of processing is not complicated, and the sample holder is convenient for the operator.

(2) Second Embodiment

A second embodiment relates to a side entry type sample holder including a cap cover which is provided on the tip portion 32 and is for sealing (protecting) the sample 203 (including before and after processing) attached to the sample table 204. A point different from the configuration of the first embodiment is that the cap cover for sealing (protecting) the sample 203 attached to the tip portion 32 is added.

FIG. 9 is a view illustrating an example of an external configuration of a side entry type sample holder 900 according to the second embodiment. FIG. 10 is a sectional view of the side entry type sample holder 900 on a plane 903 of FIG. 9. FIG. 10A illustrates a state where the cap cover completely covers the tip portion 32. FIG. 10B illustrates a view illustrating a middle state of moving the cap cover until the sample 203 is exposed.

As shown in FIG. 9, the side entry type sample holder 900 includes cap bases 901 formed by, for example, a circular plate (which may also be an elliptic plate) and a cap movable portion 902 formed by, for example, a cylinder (which may also adopt a pipe shape other than a cylindrical shape), in the vicinity of a position of the tip portion 32 on which the sample 203 is placed. As shown in FIG. 10, each cap base 901 is fixed to the tip portion 32 and the holder main body 35. Since the cap movable portion 902 is formed as the cylinder, it is possible to operate so as to seal a space inside the cap base 901. For example, an operation mechanism of the cap movable portion 902 may be a type of sliding in a plane perpendicular to the irradiation direction of the electron beam 602, and may be a type of rotating along a rotation axis by providing the rotation axis. An operation method of the cap movable portion 902 may be, for example, a method of moving automatically by providing a motor or the like, and also be a method of performing an operation from the outside of the sample chamber 10 by providing a rotation introduction device or the like on the side entry type sample holder 30. In addition, a manipulator or the like may be provided to a tip of the holder to perform operation by the manipulator. Further, various operation mechanisms and operation methods can be adopted.

FIG. 11 is a view illustrating an aspect in which the tip portion 32 is completely exposed and the tip portion 32 is rotated about a rotation shaft 33 as the center to be in a vertical state. The tip portion 32 can be folded in the downward direction 303 about the rotation shaft 33 as the center using the tip portion rotation mechanism as illustrated in the first embodiment so as to be in the vertical state. In this manner, the tip portion is set to the vertical state, whereby the placed sample 203 can be processed with the ion beam 501. Since the cap movable portion 902 is in a completely retracted state (a state where the sample 203 is exposed in the space of the sample chamber), the tip portion 32 and the cap movable portion 902 do not interfere with each other. After processing the sample 203, the tip portion 32 returns to an original position thereof (from the vertical state to the horizontal state). Next, by operating the operation mechanism described above, the operator (user) moves the cap movable portion 902 in an arrow X1 direction until the cap movable portion 902 completely covers the sample 203 (which has been processed) placed on the sample table 204 of the tip portion. Thereafter, the operator extracts the side entry type sample holder 30 from the sample chamber 10 (see FIG. 1) and attaches the side entry type sample holder 30 to an observation apparatus (not illustrated). Accordingly, it is possible to observe the ion beam 603 of the sample 203. The cap base 901 is desirably made of a material that is difficult to be scraped off by the ion beam 501.

FIG. 12 is a view illustrating an aspect in which the side entry type sample holder 30 is attached to an observation apparatus (not illustrated) to observe the processing surface 603. First, the side entry type sample holder 30 taken out from the sample chamber 10 of the ion milling apparatus 1 is attached to (inserted into) the observation apparatus (not illustrated). Next, the operator operates the movement mechanism of the cap movable portion 902 to move the cap movable portion 902 in an arrow X2 direction to a position where the processing surface 603 of the sample 203 can be observed (or to the completely retracted position of the cap movable portion 902). Then, the operator observes the processing surface 603 by irradiating the processing surface 603 of the sample 203 with the electron beam 602. When observing the processing surface 603, it is not required to set the tip portion 32 to be in the vertical state as described above.

By providing the cap cover described above at the tip of the side entry type sample holder 30, it is possible to avoid sample breakage, dirt, or air exposure during transport in the movement between apparatuses (for example, between the ion milling apparatus and the observation apparatus).

(3) Conclusion (i) A sample holder (side entry type sample holder) according to the present embodiment includes a grip, a sample holder main body extending from the grip, a tip portion which is connected to the sample holder main body and provided with a sample table for fixing a sample, and a mechanism which changes a relative positional relationship of the processing surface of the sample fixed to the sample table with an irradiation direction of the ion beam, and causes the tip portion to avoid irradiation with the ion beam during the sample processing. According to this, it is possible to avoid that the tip portion (pivot) of the holder is damaged by being exposed to the ion beam during processing. In addition, since a direction of the processing surface of the sample can be changed, it is possible to save troubles of removing the sample from the holder after being processed with the ion milling apparatus, and attaching the sample again to the holder of the observation apparatus, the throughput can be improved.

Specifically, the mechanism rotates the tip portion toward a direction opposite to a direction in which the ion source that performs irradiation with the ion beam has been provided, from a state where the tip portion is horizontal to the sample holder main body. The tip portion rotates about a rotation shaft provided at a connecting portion between the tip portion and the sample holder main body. It is possible to prevent the tip portion from being exposed to the ion beam, with such a simple configuration.

Further specifically, the mechanism includes a first shaft that is housed inside the sample holder main body, extends in a direction from the connecting portion between the tip portion and the sample holder to the grip, and has a first gear and a second shaft that has the same axis as the rotation shaft of the tip portion. The first shaft has a first gear and the second shaft has a second gear, respectively. Then, when a rotational force for rotating the first shaft is applied around an axis of the first shaft, the rotational force is transmitted to the second gear via the first gear to rotate the second shaft. Since the second shaft is attached to the tip portion, the tip portion also rotates in the same manner, by rotating the second shaft. Since such a simple configuration can be adopted, it is possible to ensure the durability of the mechanism which rotates the tip portion.

In a state where the tip portion is horizontal to the sample holder main body, the sample table fixes the sample so that the processing surface of the sample faces the ion source that performs irradiation with the ion beam. On the other hand, in a state where the tip portion has been rotated to a side opposite to the direction in which the ion source is provided, the sample table fixes the sample so that the processing surface becomes horizontal to the irradiation direction of the ion beam. That is, a posture of the tip portion is changed by approximately 90 degrees by the mechanism, accordingly, a posture of the sample fixed to the tip portion is changed by approximately 90 degrees. In this manner, since the position of the processing surface with respect to the ion source (also for the charged particle beam source (electron source) in the observation apparatus) can be changed, both the processing and observation can be performed without removing the sample from the sample holder.

(ii) The ion milling apparatus according to the present embodiment further includes a swing mechanism that rotates the tip portion of the sample holder by predetermined angle clockwise and counterclockwise about an axis of the sample holder main body, in addition to having the sample holder described above. Specifically, the swing mechanism includes a motor, a control unit that controls a rotation of the motor, and a stage side gear that meshes with a gear of the motor and is provided outside the stage. The stage rotates by a predetermined angle clockwise and counterclockwise about the axis of the sample holder according to the rotation of the motor, thereby rotating the sample holder attached to the stage by the predetermined angle. According to this, it is possible to prevent the streaks from being formed on the processing surface when processing the sample with the ion beam.

(iii) A sample processing method according to the present embodiment includes: a step of performing predetermined preparing on the sample (cutting the sample or grinding the processing surface to obtain a desired sample size); a step of fixing the sample to a sample table provided on the tip portion of the sample holder so that the processing surface of the sample faces an ion source when inserting the side entry type sample holder into the sample chamber of the ion milling apparatus (at this time, it is desirable that the shielding plate is placed on an upper face of the sample); a step of inserting the sample holder into the sample chamber of the ion milling apparatus; a step of causing the processing surface of the sample fixed to the sample table to be parallel to an irradiation direction of the ion beam by rotating the tip portion of the sample holder to a side opposite to a direction in which the ion source is provided; a step of irradiating the sample with the ion beam to process the sample; a step of changing the processing surface from a state parallel to the irradiation direction of the ion beam to a state facing the ion source by rotating the tip portion of the sample holder in a direction in which the ion source is provided, after finishing the processing of the sample; and a step of extracting the sample holder on which the sample after subjected to the processing is placed, from the sample chamber. By performing these steps, during the sample processing, the tip portion of the sample holder can be protected from damage caused by the irradiation with the ion beam.

In the step of processing the sample, a swing mechanism, that the ion milling apparatus has, may rotate the tip portion of the sample holder by predetermined angle clockwise and counterclockwise about an axis of the sample holder main body. Accordingly, it is possible to prevent stripes from being formed on the processing surface of the sample due to the irradiation with the ion beam.

(iv) A sample observing method according to the present embodiment includes: a step of inserting the sample holder (the tip portion and the sample holder main body are in the horizontal state) extracted from the sample chamber of the ion milling apparatus into the observation apparatus while being in a state of attaching the sample to the sample holder; and a step of observing the processing surface of the sample using the observation apparatus. The sample holder used here includes a grip, a sample holder main body extending from the grip, the tip portion which is connected to the sample holder main body and provided with the sample table, and a mechanism which rotates the tip portion toward a direction opposite to a direction in which the charged particle beam source of the observation apparatus is provided from a state where the tip portion is horizontal to the sample holder main body and changes a relative positional relationship between the processing surface of the sample fixed to the sample table and the irradiation direction of the charged particle beam. In the step of insertion to the observation apparatus and the step of observation, the tip portion is horizontal to the sample holder main body and the processing surface of the sample is in a state of facing the charged particle beam source of the observation apparatus. Accordingly, in a case where the sample is observed with the observation apparatus, the tip portion is not rotated by the mechanism of the sample holder. In this manner, since the sample holder extracted from the sample chamber of the ion milling apparatus can be inserted into the observation apparatus as it is (it is not required to remove the sample from the sample table), steps for observation can be simplified and the throughput can be improved. In addition, even in a case where it is determined that the milling processing is insufficient, the sample holder can be extracted from the observation apparatus to insert into the ion milling apparatus as it is. Therefore, the procedure of processing and observation is simple and usability is extremely good. Further, since it is not required to remove the sample from the sample holder, it is possible to reduce a concern that the sample is damaged.

REFERENCE SIGNS LIST

1: Ion milling apparatus
10: Sample chamber
11: Flare prevention diaphragm
20: Stage
21: Stage side gear
22: Rotation base
30: Side entry type sample holder
31: Rotation shaft (Sample holder main body)
32: Tip portion
33: Rotation shaft (Tip portion)
34: Grip
35: Sample holder main body
36: Knob
40: Motor
41: Motor side gear
50: Control unit
60: Ion gun
202: Shielding plate
203: Sample
206: Processing surface

The invention claimed is:

1. A sample holder comprising:
a grip;
a sample holder main body extending from the grip, wherein the sample holder is configured to be inserted in an ion milling apparatus so as to transverse an irradiation locus of an ion beam and to be extracted from the ion milling apparatus after a sample processing;
a tip portion which is connected to the sample holder main body and provided with a sample table for fixing a sample; and
a mechanism which changes a relative positional relationship between a processing surface of the sample fixed to the sample table and an irradiation direction of the ion beam, and causes the tip portion to avoid irradiation with the ion beam during sample processing, wherein the tip portion is pivoted about the sample holder main body with the sample table interposed therebetween.

2. The sample holder according to claim 1, wherein
in a state where the tip portion is horizontal to the sample holder main body, the mechanism rotates the tip portion toward a direction opposite to a direction in which an ion source that performs irradiation with the ion beam is provided.

3. The sample holder according to claim 2, wherein
the mechanism rotates the tip portion about a rotation shaft provided at a connecting portion between the tip portion and the sample holder main body.

4. The sample holder according to claim 3, wherein
the mechanism includes
a first shaft that is housed inside the sample holder main body, extends in a direction from the connecting portion to the grip, and includes a first gear, and
a second shaft that has the same axis as the rotation shaft and includes a second gear, and
when a rotational force for rotating the first shaft is applied around an axis of the first shaft, the rotational force is transmitted to the second gear via the first gear to rotate the second shaft.

5. The sample holder according to claim 2, wherein
in a state where the tip portion is horizontal to the sample holder main body, the sample table fixes the sample so that a processing surface of the sample faces the ion source that performs irradiation with the ion beam.

6. The sample holder according to claim 5, wherein
in a state where the tip portion is rotated to a side opposite to the direction in which the ion source is provided, the sample table fixes the sample so that the processing surface becomes parallel to the irradiation direction of the ion beam.

7. An ion milling apparatus that processes a sample using an ion beam, the apparatus comprising:
a sample chamber;
an ion source that emits the ion beam and is attached to the sample chamber;
a sample holder which is inserted so as to transverse an irradiation locus of the ion beam and is extracted after sample processing; and
a stage that holds the inserted sample holder, wherein the sample holder includes
a grip,
a sample holder main body extending from the grip,
a tip portion which is connected to the sample holder main body and provided with a sample table for fixing the sample, and
a mechanism which rotates the tip portion toward a direction opposite to a direction in which the ion source that performs irradiation with the ion beam is provided from a state where the tip portion is horizontal to the sample holder main body, changes a relative positional relationship between a processing surface of the sample fixed to the sample table and an irradiation direction of the ion beam, and causes the tip portion to avoid irradiation with the ion beam during the sample processing, wherein
the tip portion is pivoted about the sample holder main body with the sample table interposed therebetween.

8. The ion milling apparatus according to claim 7, wherein
the mechanism in the sample holder rotates the tip portion about a rotation shaft provided at a connecting portion between the tip portion and the sample holder main body, and
the mechanism includes a first shaft that is housed inside the sample holder main body, extends in a direction from the connecting portion to the grip, and includes a first gear, and a second shaft that has the same axis as the rotation shaft and includes a second gear when a rotational force for rotating the first shaft is applied around an axis of the first shaft, the rotational force is transmitted to the second gear via the first gear to rotate the second shaft.

9. The ion milling apparatus according to claim 7, further comprising:

a swing mechanism that rotates the tip portion of the sample holder by a predetermined angle clockwise and counterclockwise about an axis of the sample holder main body.

10. The ion milling apparatus according to claim 9, wherein the swing mechanism includes a motor, a control unit that controls a rotation of the motor, and a stage side gear that meshes with a gear of the motor and is provided outside the stage, when the stage is rotated by a predetermined angle clockwise and counterclockwise about the axis of the sample holder according to the rotation of the motor, the sample holder attached to the stage is rotated by the predetermined angle.

11. The ion milling apparatus according to claim 7, further comprising:

a diaphragm that defines a range to be irradiated with the ion beam; and a shielding plate that covers a portion of the sample other than a portion to be milled by the ion beam.

* * * * *